(12) United States Patent
Wang

(10) Patent No.: US 11,397,359 B2
(45) Date of Patent: Jul. 26, 2022

(54) THIN FILM TRANSISTOR ARRAY SUBSTRATE, MANUFACTURING METHOD THEREOF, AND DISPLAY PANEL

(71) Applicant: WUHAN CHINA STAR OPTOELECTRONICS TECHNOLOGY CO., LTD., Hubei (CN)

(72) Inventor: Chuan Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 68 days.

(21) Appl. No.: 16/349,663

(22) PCT Filed: Nov. 14, 2018

(86) PCT No.: PCT/CN2018/115494
§ 371 (c)(1),
(2) Date: Oct. 22, 2020

(87) PCT Pub. No.: WO2020/062483
PCT Pub. Date: Apr. 2, 2020

(65) Prior Publication Data
US 2021/0072577 A1 Mar. 11, 2021

(30) Foreign Application Priority Data
Sep. 30, 2018 (CN) .......................... 201811154056.7

(51) Int. Cl.
*G02F 1/1368* (2006.01)
*G02F 1/1343* (2006.01)
*G02F 1/1362* (2006.01)
*H01L 23/552* (2006.01)
*H01L 27/12* (2006.01)
*H01L 29/423* (2006.01)

(52) U.S. Cl.
CPC ...... *G02F 1/1368* (2013.01); *G02F 1/134309* (2013.01); *G02F 1/136209* (2013.01); *H01L 23/552* (2013.01); *H01L 27/124* (2013.01); *H01L 27/1259* (2013.01); *H01L 29/42384* (2013.01)

(58) Field of Classification Search
CPC ............. G02F 1/1368; G02F 1/134309; G02F 1/136209; H01L 23/552; H01L 27/124; H01L 27/1259; H01L 29/42384
USPC ...................................... 349/46–48
See application file for complete search history.

(56) References Cited

U.S. PATENT DOCUMENTS

2016/0370621 A1* 12/2016 Huang .............. H01L 29/78633

* cited by examiner

*Primary Examiner* — Charles S Chang
(74) *Attorney, Agent, or Firm* — Mark M. Friedman

(57) ABSTRACT

The present invention discloses a thin film transistor array substrate, a manufacturing method thereof, and a display panel. In the present invention, a width of the channel is increased by cooperation of an electrically connection between the interdigital gate and the interdigital light-shielding layer with design of the interdigital gate. When a width/length ratio (W/L) of the channels in a single thin film crystal device is maintained constant, an increase in the channel width allows the width of the channel layer occupied by the channels to be reduced while maintaining the total width of the channels in the single thin film transistor constant, thereby reducing the area occupied by the single thin film transistor device.

20 Claims, 3 Drawing Sheets

THIN FILM TRANSISTOR ARRAY SUBSTRATE, MANUFACTURING METHOD THEREOF, AND DISPLAY PANEL

BACKGROUND OF THE INVENTION

Field of Invention

The present invention relates to a field of thin film transistor technologies, and in particular, to a thin film transistor array substrate, a method of manufacturing the same, and a display panel.

Description of Prior Art

Thin film transistor (TFT) devices are important electronic components in a liquid crystal display, and constitute various control circuits inside the liquid crystal display. FIG. 1 is a cross-sectional view of a thin film transistor device widely used in a conventional liquid crystal display, which has a problem that an area occupied by the TFT device is too large, resulting in an increase in manufacturing cost.

Therefore, it is necessary to propose a technical solution to solve the problem that the area occupied by the existing TFT device is too large, resulting in an increase in manufacturing cost.

SUMMARY OF THE INVENTION

Technical Problem

An object of the invention is to provide a thin film transistor array substrate, a manufacturing method thereof, and a display panel, to solve the problem that the area occupied by the conventional thin film transistor is too large, resulting in an increase in manufacturing cost.

The Solution to the Problem

Technical Solution

The present invention provides a thin film transistor array substrate, including:
an interdigital light-shielding layer formed on a substrate;
a buffer layer covering the interdigital light-shielding layer and the substrate;
a channel layer formed on the buffer layer;
a first insulating layer covering the channel layer and the buffer layer;
an interdigital gate formed on the first insulating layer and above the interdigital light-shielding layer;
a second insulating layer covering the interdigital gate and the first insulating layer and;
at least one first electrode and at least two second electrodes covering vias defined in the first insulating layer and the second insulating layer to connect the channel layer, wherein the second electrodes are located at opposite sides of the interdigital gate, and spaced apart from the first electrode;
wherein the interdigital light-shielding layer is electrically connected to the interdigital gate.

In the thin film transistor array substrate, a projection of the interdigital gate along a first direction overlaps the interdigital light-shielding layer, and the first direction is perpendicular to a horizontal plane of the substrate and extends along a direction from the interdigital gate to the interdigital light-shielding layer.

In the thin film transistor array substrate, the interdigital light-shielding layer and the interdigital gate are connected by an electrically conductive layer.

In the thin film transistor array substrate, the electrically conductive layer is a gate line extending from the interdigital gate and covering a via in the buffer layer.

In the thin film transistor array substrate, the buffer layer includes a silicon nitride layer and a silicon oxide layer sequentially covering the interdigital light-shielding layer and the substrate, and the insulating layer includes a silicon oxide layer and a silicon nitride layer sequentially covering the channel layer and the buffer layer.

In the thin film transistor array substrate, the interdigital light-shielding layer is made of at least one of molybdenum, aluminum, copper, and titanium.

In the thin film transistor array substrate, the interdigital gate is made of at least one of molybdenum, aluminum, copper, and titanium.

The present invention also provides a method of manufacturing a thin film transistor array substrate, including the following steps:
forming an interdigital light-shielding layer on a substrate;
forming a buffer layer covering the interdigital light-shielding layer and the substrate,
forming a channel layer on the buffer layer,
forming a first insulating layer covering the channel layer and the buffer layer,
forming an interdigital gate on the first insulating layer and above the interdigital light-shielding layer,
forming a second insulating layer covering the interdigital gate and the first insulating layer, and
forming at least one first electrode and at least two second electrodes covering vias defined in the first insulating layer and the second insulating layer to connect the channel layer, wherein the second electrodes are located at opposite sides of the interdigital gate and spaced apart from the first electrode;
wherein the interdigital light-shielding layer is electrically connected to the interdigital gate.

In the method of manufacturing the thin film transistor array substrate, a projection of the interdigital gate along a first direction overlaps the interdigital light-shielding layer, and the first direction is perpendicular to a horizontal plane of the substrate and extends along a direction from the interdigital gate to the interdigital light-shielding layer.

In the method of manufacturing a thin film transistor array substrate, the interdigital light-shielding layer and the interdigital gate are connected by an electrically conductive layer, and the electrically conductive layer is a gate line extending from the interdigital gate and covering a via in the buffer layer.

In the method of manufacturing the thin film transistor array substrate, the buffer layer includes a silicon nitride layer and a silicon oxide layer sequentially covering the interdigital light-shielding layer and the substrate, and the first insulating layer includes a silicon oxide layer and a silicon nitride layer sequentially covering the channel layer and the buffer layer.

In the method of manufacturing the thin film transistor array substrate, the interdigital light-shielding layer is made of at least one of molybdenum, aluminum, copper, and titanium.

In the method of manufacturing the thin film transistor array substrate, the interdigital gate is made of at least one of molybdenum, aluminum, copper, and titanium.

The present invention further provides a display panel including the above described thin film transistor array substrate.

In the display panel, a projection of the interdigital gate along a first direction overlaps the interdigital light-shielding layer, and the first direction is perpendicular to a horizontal plane of the substrate and extends along a direction from the interdigital gate to the interdigital light-shielding layer.

In the display panel, the interdigital light-shielding layer and the interdigital gate are connected by an electrically conductive layer.

In the display panel, the electrically conductive layer is a gate line extending from the interdigital gate and covering a via in the buffer layer.

In the display panel, the buffer layer includes a silicon nitride layer and a silicon oxide layer sequentially covering the interdigital light-shielding layer and the substrate, and the first insulating layer includes a silicon oxide layer and a silicon nitride layer sequentially covering the channel layer and the buffer layer.

In the display panel, the interdigital light-shielding layer is made of at least one of molybdenum, aluminum, copper, and titanium.

In the display panel, the interdigital gate is made of at least one of molybdenum, aluminum, copper, and titanium.

The Invention has the Beneficial Effects

Beneficial Effect

In the present invention, the channel width is increased with the cooperation of an electrical connection between the interdigital gate and the interdigital light-shielding layer and the design of the interdigital gate. When a width/length ratio (W/L) of the channels in a single thin film crystal device is maintained constant, an increase in the channel width allows the width of the channel layer occupied by the channels to be reduced while maintaining the total width of the channels in the single thin film transistor constant, thereby reducing the area occupied by the single thin film transistor device, thus improving utilization rate of the channel layer and reducing the production cost.

BRIEF DESCRIPTION OF THE DRAWINGS

Description of the Drawings

Figure 1:
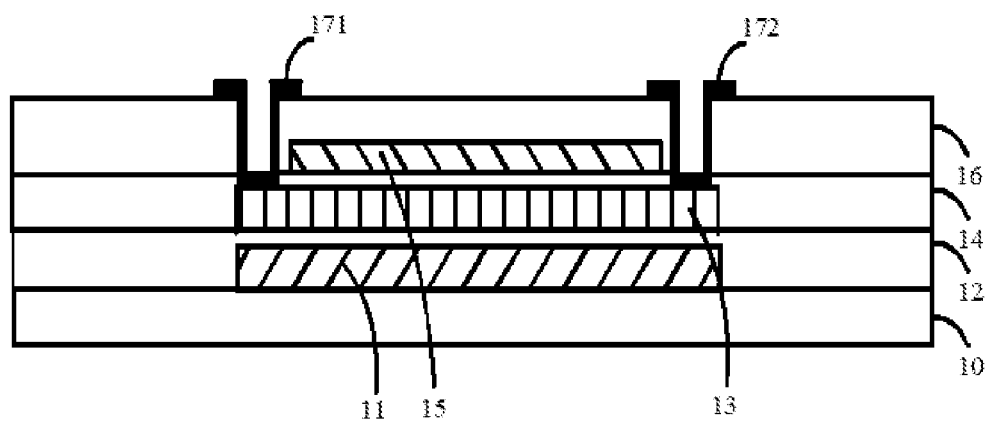

FIG. 1 is a cross-sectional view of a thin film transistor device of the prior art;

FIGS. 2A-2H are schematic structural views showing a process of manufacturing a thin film transistor array substrate according to a first embodiment of the present invention.

Elements in the drawings are designated by reference numerals listed below:

10, 20 substrate; 11 light-shielding layer; 21 interdigital light-shielding layer; 211 light-shielding strip; 12, 22 buffer layer; 13, 23 channel layer; 14, 24 first insulating layer; 15 gate; 25 interdigital gate; 251 gate lines; 16, 26 second insulating layer; 171, 271 source electrode; 172, 272 drain electrode.

DETAILED DESCRIPTION OF THE PREFERRED EMBODIMENTS

Embodiment of the Invention

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Figure 2A:
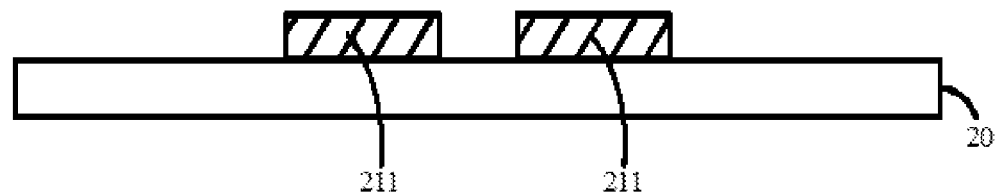

FIGS. 2A-2H show schematic structural diagrams related to a method of forming a thin film transistor array substrate according to a first embodiment of the present invention, including the following steps:

S11: As shown in FIG. 2A, an interdigital light-shielding layer 21 is formed on a substrate 20.

The substrate 20 may be any one of a glass substrate a plastic substrate, a flexible base, or a flexible substrate, but not specifically limited thereto in the present invention.

Figure 2B:
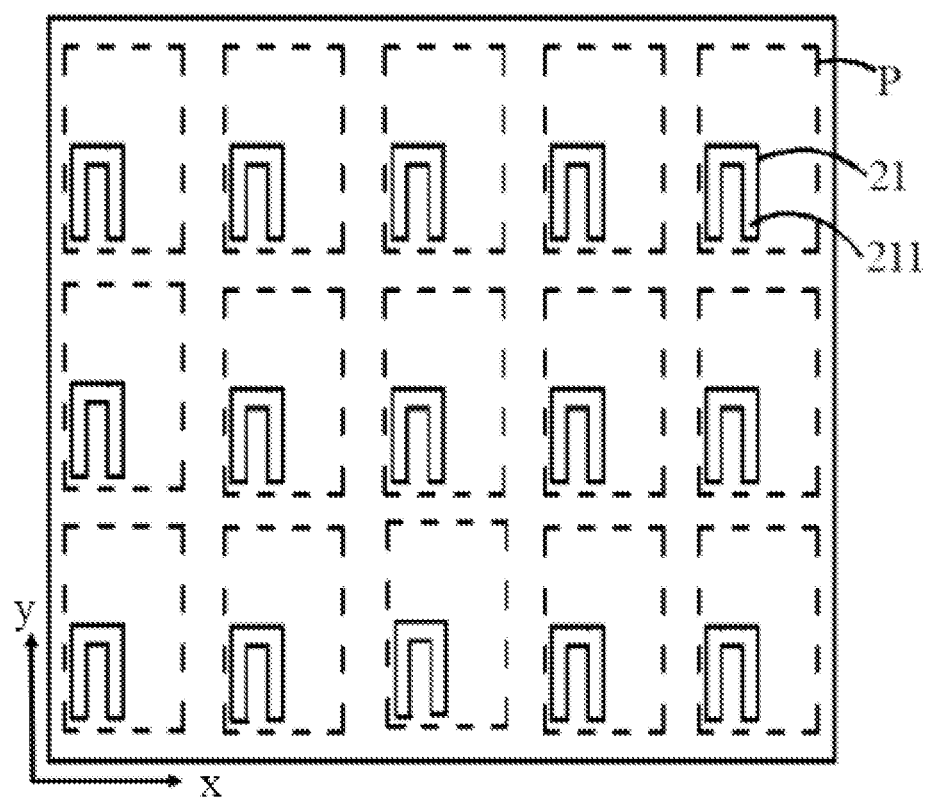

The interdigital light-shielding layer 21 is configurated to shield the backlight, preventing a subsequently formed channel layer from generating photo-carriers caused by backlight, which results in an increase in leakage current of the thin film transistor. The interdigital light-shielding layer 21 includes at least two light-shielding strips 211, wherein the light-shielding strips 211 are arranged in parallel along the x-direction of the horizontal plane of the substrate 20. One end of the light-shielding strip 211 is connected to a main line of the light-shielding layer, and a straight line along the light-shielding strip 211 is parallel to the y-direction of the horizontal plane of the substrate 20, while the straight line along the main line of the light-shielding layer is perpendicular the y direction of the horizontal plane of the substrate. The x and y directions of the horizontal plane of the substrate are perpendicular to each other. Specifically, in this embodiment, as shown in FIG. 2B, it is a schematic top view of the interdigital light-shielding layer on the substrate 20. The substrate 20 has a plurality of pixel regions P and a thin film transistor at a corner of the pixel region P. The interdigital light-shielding layer 21 is a component of the thin film transistor, and is also located at a corner of the pixel region P. The interdigital light-shielding layer 21 is composed of two light-shielding strips 211 and a main line of light-shielding layer connecting the two light-shielding strips 211. The two light-shielding strips 211 are strip-shaped and are arranged in parallel along the x-direction of the horizontal plane of the substrate 20, and the straight line along the main line of the light-shielding layer is parallel to the x-direction of the horizontal plane of the substrate 20. The interdigital light-shielding layer 21 is made of at least one of molybdenum, aluminum, copper, and titanium; and the interdigital light-shielding layer has a thickness of 500 to 2000 angstroms.

In the present embodiment, the interdigital light-shielding layer 21 is formed by a mask process Mask-1. Specifically, after the substrate 20 is cleaned and dried, a light-shielding layer of is blanketly deposited on the substrate 20 by chemical deposition, and then a photoresist is blanketly coated on the light-shielding layer and pre-baked. After that, the photoresist is exposed through a mask, and developed by a developing solution, and the photoresist not developed by the developing solution is remained and the light-shielding layer not covered by the remaining photoresist is etched. Finally, the photoresist not developed by the developer is removed, and the interdigital light-shielding layer 21 is obtained.

Figure 2C:
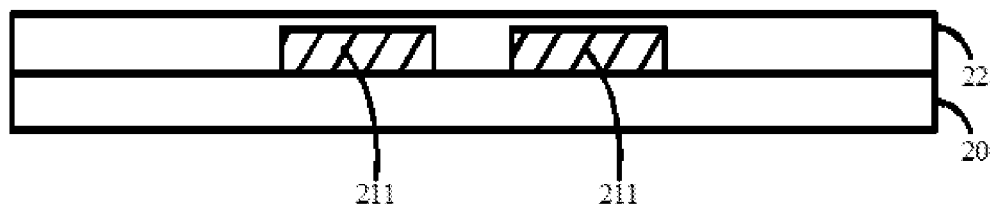

S12: As shown in FIG. 2C, a buffer layer 22 covering the interdigital light-shielding layer 21 and the substrate 20 is formed.

The buffer layer 22 functions to prevent impurities in the substrate 20 from diffusing upward in a subsequent process to negatively affect the performance of the channel layer or functions to insulate heat to protect the substrate 20. The buffer layer 22 is a silicon oxide layer, a silicon nitride layer, a stack of layers of silicon oxide and silicon oxide, or other non-electrically conductive layers. The buffer layer 22 has a thickness of 1000-5000 angstroms, which can be formed by any one of chemical vapor deposition, plasma chemical vapor deposition, sputter deposition, vacuum evaporation, and low-pressure chemical vapor deposition.

Figure 2D:
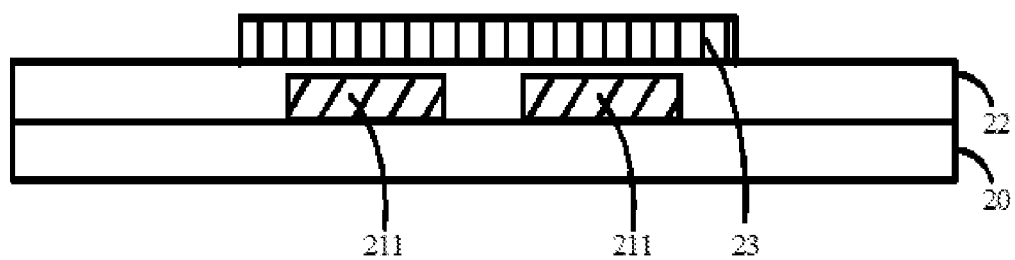

S13: As shown in FIG. 2D, a channel layer 23 is formed on the buffer layer 22.

The channel layer 23 is employed to conduct an electric current between the source electrode and the drain electrode, and the electric current can be controlled by adjusting the composition of the channel. The channel layer 23 includes a semiconductor material such as a silicon-based semiconductor or a metal oxide semiconductor.

Specifically, in the embodiment, the channel layer 23 is a polysilicon layer, and an amorphous silicon layer is blanketly formed on the buffer layer 22, and then the amorphous silicon layer is patterned by a mask process Mask-2. After that, the patterned amorphous silicon crystalline layer is subjected to an excimer laser annealing (ELA) treatment, to obtain the channel layer 23. The steps of the mask process Mask-2 is the same as the above-mentioned mask process Mask-1, and details are not repeated herein for brevity. In order to adjust the mobility of carriers in the channel, the channel layer may be ion doped, such as phosphorus doped or boron doped.

Figure 2E:
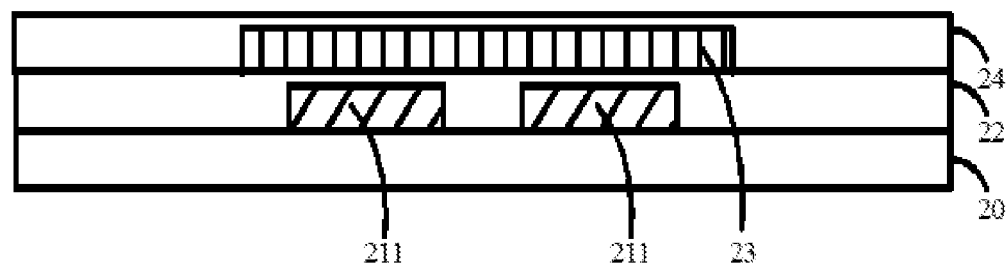

S14: As shown in FIG. 2E, a first insulating layer 24 covering the channel layer 23 and the buffer layer 22 is formed.

The first insulating layer 24, also referred to as a gate insulating layer, functions to insulate between the channel layer and the interdigital gate. The first insulating layer 24 is obtained by using any one of chemical vapor deposition, plasma chemical vapor deposition, sputter deposition, or vacuum evaporation, to blanketly form an insulating layer covering the channel layer 23 and the buffer layer 22. The material of the first insulating layer 24 may be any one of silicon oxide, silicon nitride, or silicon oxynitride. The first insulating layer has a thickness of 1000-3000 angstroms.

Figure 2F:
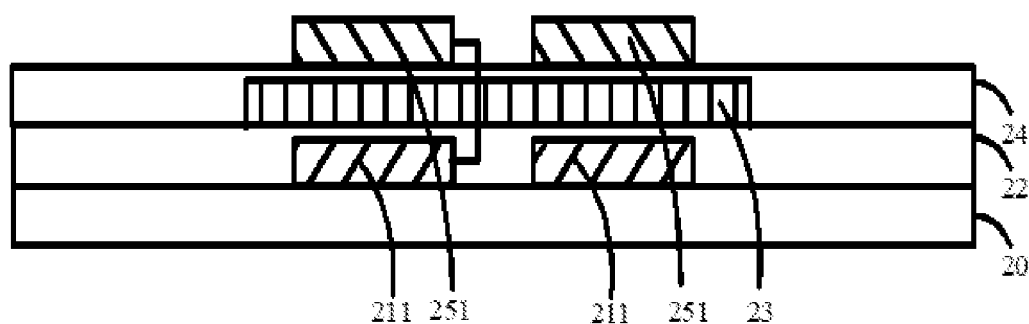

S15: As shown in FIG. 2F, an interdigital gate electrode 25 is formed on the first insulating layer 24 located above the interdigital light-shielding layer 21.

The interdigital gate electrode 25 includes at least two gate lines 251 arranged in parallel along the x direction of the horizontal plane of the substrate 20, and one end of the gate line 251 is connected to a main gate line. A straight line along the light-shielding strip 211 is parallel to the y-direction of the horizontal plane of the substrate 20, while the main gate line is perpendicular the y direction of the horizontal plane of the substrate. Specifically, in the embodiment, the interdigital gate 25 is composed of two gate lines 251 and a main gate line 252 connecting the two gate lines 251. The widths of the two gate lines 251 are the same, and the lengths of the two gate lines 251 not specifically limited thereto. The interdigital gate electrode 25 is electrically connected to the interdigital light-shielding layer 21, and for clarity, an electrical connection relationship between the interdigital gate electrode 25 and the interdigital light-shielding layer 21 is indicated by a wire in FIG. 2F.

In the embodiment, the interdigital gate 25 is formed by a mask process Mask-3. The steps of the mask process Mask-3 are the same as those of the mask process Mask-1, and details are not repeated herein for brevity. The interdigital gate 25 may be made of at least one of molybdenum, aluminum, copper, and titanium. The interdigital gate has a thickness of 500 to 2000 angstroms.

In this embodiment, the channel width is increased with the cooperation of an electrical connection between the interdigital gate and the interdigital light-shielding layer and the design of the interdigital gate. When a width/length ratio (W/L) of the channels in a single thin film crystal device is maintained constant, an increase in the channel width allows the width of the channel layer occupied by the channels to be reduced while maintaining the total width of the channels in the single thin film transistor constant, thereby reducing the area occupied by the single thin film transistor device, thus improving the utilization rate of the channel layer and reducing the production cost.

Figure 2G:
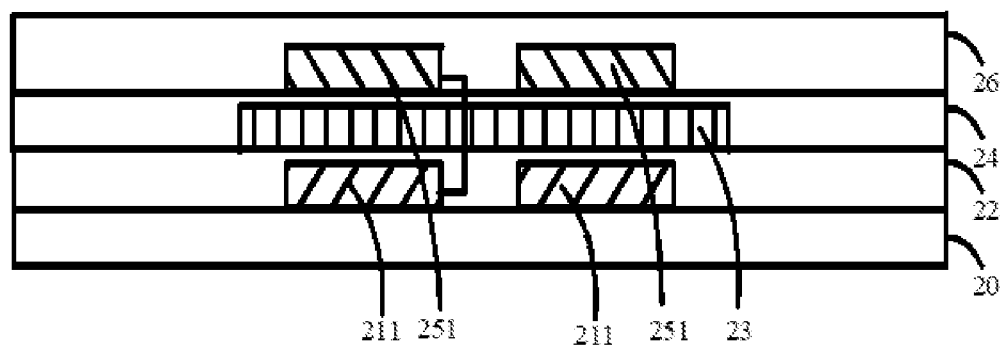

S16: As shown in FIG. 2G, a second insulating layer 26 covering the interdigital gate 25 and the first insulating layer 24 is formed.

The second insulating layer 26 is also referred to as an interlayer insulating layer, formed by using any one of chemical vapor deposition, plasma chemical vapor deposition, sputter deposition, or vacuum evaporation, to blanketly form an insulating layer covering the interdigital gate 25 and the first insulating layer 24, thereby obtaining a second insulating layer 26. The second insulating layer 26 may be made of any one of silicon oxide, silicon nitride or silicon oxynitride, and the second insulating layer has a thickness of 1-4 microns.

In this embodiment, at least three vias are defined in the first insulating layer 24 and the second insulating layer 26 through a mask process Mask-4. The three vias all expose a portion of the channel layer, to provide conditions for subsequent formation of the source electrode and the drain electrode spaced apart from each other, and connections of both the source and drain electrodes to the channel layer. The steps of the mask process Mask-4 is the same as those of the mask process Mask-1, and details are not repeated herein for brevity.

Figure 2H:
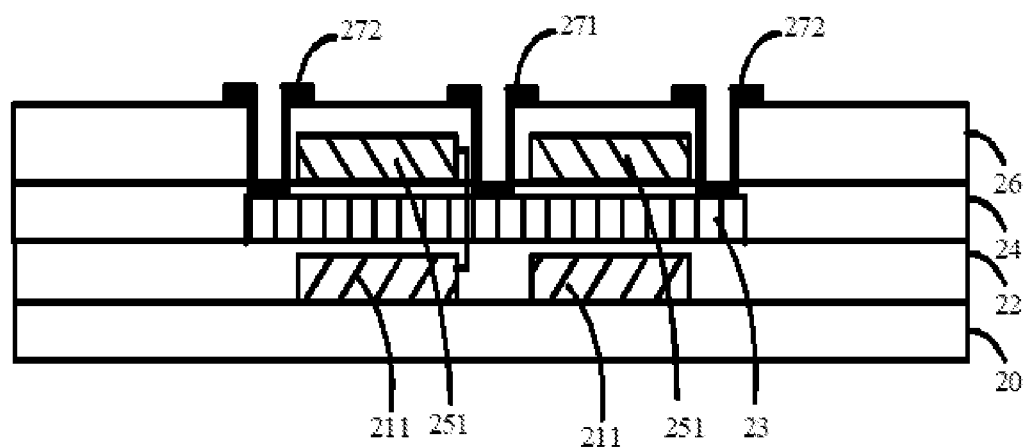

S17: As shown in FIG. 2H, at least one first electrode 271 and at least two second electrodes 272 are formed. The first electrode 271 and the second electrodes 272 cover the vias defined in the first insulating layer 24 and the second insulating layer 26, to connect the channel layer 23. The second electrodes 272 are located at opposite sides of the interdigital gate 25, and the second electrodes 272 are arranged spaced apart from the first electrodes 271.

In this embodiment, the first electrode 271 and the two second electrodes 272 are formed by a mask process Mask-5 on the interlayer insulating layer in which the vias are defined. The first electrode 271 is a source electrode, and the second electrode 272 is a drain electrode. The first electrode 271 is located between the two gate lines 251 of the interdigital gate 25, while the two second electrodes 272 are respectively located at opposite sides of the interdigital gate 25 and spaced apart from the first electrode 271. Materials of the first electrode 271 and the second electrode 272 include, but are not limited to, aluminum, molybdenum, titanium, chromium, copper, metal oxide, metal alloy, other conductive material, ITO (indium cation oxide), or a stacked electrode composed of two layers of ITO and silver between the two layers of ITO. The steps of the mask process Mask-5 are the same as those of the mask process Mask-1, and details are not repeated herein for brevity. A channel is defined between one source electrode and one drain electrode in the channel layer, and the channel has a width parallel to the y direction of the horizontal plane of the substrate 20, while the channel has a length parallel to the x direction of the horizontal plane of the substrate 20.

The present invention also provides a thin film transistor array substrate prepared by the above method, including:

an interdigital light-shielding layer 21 formed on the substrate 20;

a buffer layer 22 covering the interdigital light-shielding layer 21 and the substrate 20;

a channel layer 23 formed on the buffer layer 22;

a first insulating layer 24 covering the channel layer 23 and the buffer layer 22;

an interdigital gate 25 formed on the first insulating layer 24 and above the interdigital light-shielding layer 21;

a second insulating layer 26 covering the interdigital gate 25 and the first insulating layer 24;

at least one first electrode 271 and at least two second electrodes 272 covering vias defined in the first insulating layer 24 and the second insulating layer 26 to be connected to the channel layer 23, wherein the second electrodes 272 are located at opposite sides of the interdigital gate 25, and the second electrode 272 is arranged apart from the first electrode 271; wherein the interdigital light-shielding layer 21 is electrically connected to the interdigital gate 25.

Further, a projection of the interdigital gate 25 along a first direction overlaps the interdigital light-shielding layer 21, and the first direction is perpendicular to a horizontal plane of the substrate 20 and extends along a direction from the interdigital gate 25 to the interdigital light-shielding layer 21. The interdigital gate 25 and the interdigital light-shielding layer 21 have the same pattern and are disposed correspondingly, which is advantageous for improving the reliability of the device, through avoiding the breakdown of the device caused by excessive electric field of the drain electrode, and avoiding excessive leakage current, and excessive parasitic capacitance.

Furthermore, the interdigital light-shielding layer 21 and the interdigital gate 25 are connected by an electrically conductive layer which may include a conductive material, and the electrically conductive layer may also be a gate line extending from the interdigital gate 25 and covering vias in the buffer layer 22. During formation of the interdigital gate electrode 25, vias are formed in the buffer layer 22, and covered by the gate layer, such that a gate line connecting the interdigital gate electrode 25 and the interdigital light-shielding layer 21 is obtained.

In addition, the buffer layer 22 includes a silicon nitride layer and a silicon oxide layer sequentially covering the interdigital light-shielding layer 21 and the substrate 20, and the first insulating layer 24 includes a silicon oxide layer and a silicon nitride layer sequentially covering the channel layer 23 and the buffer layer 22. The combination of the buffer layer 22 and the first insulating layer 24 ensures that a turn-on voltage of the TFT on the thin film transistor array substrate of the present invention is the same as that of the existing TFT. Additionally, the buffer layer 22 formed by first depositing the silicon nitride followed by depositing the silicon oxide may advantageously prevent impurities in the substrate 20 from entering other layers in a subsequent process to degrade the electrical properties of the TFT device, and a stronger bonding between the layers can be provided to avoid delamination.

The present invention also provides a display panel including the above thin film transistor array substrate.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A thin film transistor array substrate, comprising:
   an interdigital light-shielding layer formed on a substrate;
   a buffer layer covering the interdigital light-shielding layer and the substrate;
   a channel layer formed on the buffer layer;
   a first insulating layer covering the channel layer and the buffer layer;
   an interdigital gate formed on the first insulating layer and above the interdigital light-shielding layer;
   a second insulating layer covering the interdigital gate and the first insulating layer; and
   at least one first electrode and at least two second electrodes covering vias defined in the first insulating layer and the second insulating layer to connect the channel layer, wherein the second electrodes are located at opposite sides of the interdigital gate, and spaced apart from the first electrode;
   wherein the interdigital light-shielding layer is electrically connected to the interdigital gate.

2. The thin film transistor array substrate of claim 1, wherein a projection of the interdigital gate along a first direction overlaps the interdigital light-shielding layer, and the first direction is perpendicular to a horizontal plane of the substrate and extends along a direction from the interdigital gate to the interdigital light-shielding layer.

3. The thin film transistor array substrate of claim 1, wherein the interdigital light-shielding layer and the interdigital gate are connected by an electrically conductive layer.

4. The thin film transistor array substrate of claim 3, wherein the electrically conductive layer is a gate line extending from the interdigital gate and covering a via in the buffer layer.

5. The thin film transistor array substrate of claim 1, wherein the buffer layer comprises a silicon nitride layer and a silicon oxide layer sequentially covering the interdigital light-shielding layer and the substrate, and the insulating layer comprises a silicon oxide layer and a silicon nitride layer sequentially covering the channel layer and the buffer layer.

6. The thin film transistor array substrate of claim 1, wherein the interdigital light-shielding layer is made of at least one of molybdenum, aluminum, copper, and titanium.

7. The thin film transistor array substrate of claim 1, wherein the interdigital gate is made of at least one of molybdenum, aluminum, copper, and titanium.

8. A method of manufacturing a thin film transistor array substrate, comprising the following steps:
   forming an interdigital light-shielding layer on a substrate;
   forming a buffer layer covering the interdigital light-shielding layer and the substrate;
   forming a channel layer on the buffer layer;
   forming a first insulating layer covering the channel layer and the buffer layer;
   forming an interdigital gate on the first insulating layer and above the interdigital light-shielding layer;

forming a second insulating layer covering the interdigital gate and the first insulating layer; and forming at least one first electrode and at least two second electrodes covering vias defined in the first insulating layer and the second insulating layer to connect the channel layer, wherein the second electrodes are located at opposite sides of the interdigital gate and spaced apart from the first electrode;

wherein the interdigital light-shielding layer is electrically connected to the interdigital gate.

9. The method of manufacturing a thin film transistor array substrate of claim 8, wherein a projection of the interdigital gate along a first direction overlaps the interdigital light-shielding layer, and the first direction is perpendicular to a horizontal plane of the substrate and extends along a direction from the interdigital gate to the interdigital light-shielding layer.

10. The method of manufacturing a thin film transistor array substrate of claim 8, wherein the interdigital light-shielding layer and the interdigital gate are connected by an electrically conductive layer, and the electrically conductive layer is a gate line extending from the interdigital gate and covering a via in the buffer layer.

11. The method of manufacturing a thin film transistor array substrate of claim 8, wherein the buffer layer comprises a silicon nitride layer and a silicon oxide layer sequentially covering the interdigital light-shielding layer and the substrate, and the first insulating layer comprises a silicon oxide layer and a silicon nitride layer sequentially covering the channel layer and the buffer layer.

12. The method of manufacturing a thin film transistor array substrate of claim 8, wherein the interdigital light-shielding layer is made of at least one of molybdenum, aluminum, copper, and titanium.

13. The method of manufacturing a thin film transistor array substrate of claim 8, wherein the interdigital gate is made of at least one of molybdenum, aluminum, copper, and titanium.

14. A display panel comprising a thin film transistor array substrate, wherein the thin film transistor array substrate comprises:

an interdigital light-shielding layer formed on a substrate;

a buffer layer covering the interdigital light-shielding layer and the substrate;

a channel layer formed on the buffer layer;

a first insulating layer covering the channel layer and the buffer layer;

an interdigital gate formed on the first insulating layer and above the interdigital light-shielding layer;

a second insulating layer covering the interdigital gate and the first insulating layer; and at least one first electrode and at least two second electrodes covering vias defined in the first insulating layer and the second insulating layer to connect the channel layer, wherein the second electrodes are located at opposite sides of the interdigital gate, and spaced apart from the first electrode;

wherein the interdigital light-shielding layer is electrically connected to the interdigital gate.

15. The display panel of claim 14, wherein a projection of the interdigital gate along a first direction overlaps the interdigital light-shielding layer, and the first direction is perpendicular to a horizontal plane of the substrate and extends along a direction from the interdigital gate to the interdigital light-shielding layer.

16. The display panel of claim 14, wherein the interdigital light-shielding layer and the interdigital gate are connected by an electrically conductive layer.

17. The display panel of claim 16, wherein the electrically conductive layer is a gate line extending from the interdigital gate and covering a via in the buffer layer.

18. The display panel of claim 14, wherein the buffer layer comprises a silicon nitride layer and a silicon oxide layer sequentially covering the interdigital light-shielding layer and the substrate, and the first insulation layer comprises a silicon oxide layer and a silicon nitride layer sequentially covering the channel layer and the buffer layer.

19. The display panel of claim 14, wherein the interdigital light-shielding layer is made of at least one of molybdenum, aluminum, copper, and titanium.

20. The display panel of claim 14, wherein the interdigital gate is made of at least one of molybdenum, aluminum, copper, and titanium.

* * * * *